(12) United States Patent
Shearer et al.

(10) Patent No.: US 9,583,453 B2
(45) Date of Patent: Feb. 28, 2017

(54) SEMICONDUCTOR PACKAGING CONTAINING SINTERING DIE-ATTACH MATERIAL

(71) Applicant: Ormet Circuits, Inc., San Diego, CA (US)

(72) Inventors: Catherine Shearer, San Marcos, CA (US); Michael C Matthews, Encinitas, CA (US); Peter A Matturi, Del Mar, CA (US); Eunsook Barber, San Diego, CA (US); Richard Weaver, San Diego, CA (US)

(73) Assignee: Ormet Circuits, Inc., San Diego, CA (US)

( * ) Notice: Subject to any disclaimer, the term of this patent is extended or adjusted under 35 U.S.C. 154(b) by 205 days.

(21) Appl. No.: 13/906,317

(22) Filed: May 30, 2013

(65) Prior Publication Data

US 2014/0131898 A1    May 15, 2014

Related U.S. Application Data

(60) Provisional application No. 61/653,272, filed on May 30, 2012.

(51) Int. Cl.
*H01L 23/00* (2006.01)
*H01L 21/683* (2006.01)

(52) U.S. Cl.
CPC ............. *H01L 24/27* (2013.01); *H01L 24/29* (2013.01); *H01L 24/30* (2013.01); *H01L 24/32* (2013.01);

(Continued)

(58) Field of Classification Search
USPC ........................................ 257/783
IPC .......... H01L 24/29,24/27, 24/30, 24/32, 24/83, 24/92, 2924/10253, 2924/01322, 2224/27848, 2224/2949, 2224/2936, 2224/29373, 2224/29363, 2224/29318, 2224/29357, 2224/29371, 2224/29338, 2224/29324, 2224/2939, 2224/27334, 2224/29301, 2224/2932, 24/05, 24/06, 21/6836, 24/94, 2221/68327, 2224/04026, 2224/05639, 2224/05647, 2224/05664,
(Continued)

(56) References Cited

U.S. PATENT DOCUMENTS 4,642,160 A   2/1987 Burgess
4,645,733 A   2/1987 Sullivan
(Continued)

FOREIGN PATENT DOCUMENTS

EP   0568930   3/1998
JP   53-133799   11/1978
(Continued)

*Primary Examiner* — Hrayr A Sayadian
(74) *Attorney, Agent, or Firm* — Mitchell Brustein

(57) ABSTRACT

Sintering die-attach materials provide a lead-free solution for semiconductor packages with superior electrical, thermal and mechanical performance to prior art alternatives. Wafer-applied sintering materials form a metallurgical bond to both semiconductor die and adherends as well as throughout the die-attach joint and do not remelt at the original process temperature. Application to either one or both sides of the wafer, as well as paste a film application are disclosed.

25 Claims, 4 Drawing Sheets

(52) U.S. Cl.
CPC .............. *H01L 24/83* (2013.01); *H01L 24/92* (2013.01); *H01L 21/6836* (2013.01); *H01L 24/05* (2013.01); *H01L 24/06* (2013.01); *H01L 24/94* (2013.01); *H01L 2221/68327* (2013.01); *H01L 2224/04026* (2013.01); *H01L 2224/05639* (2013.01); *H01L 2224/05644* (2013.01); *H01L 2224/05647* (2013.01); *H01L 2224/05663* (2013.01); *H01L 2224/05664* (2013.01); *H01L 2224/05669* (2013.01); *H01L 2224/05673* (2013.01); *H01L 2224/05676* (2013.01); *H01L 2224/05678* (2013.01); *H01L 2224/06181* (2013.01); *H01L 2224/27003* (2013.01); *H01L 2224/278* (2013.01); *H01L 2224/2731* (2013.01); *H01L 2224/2732* (2013.01); *H01L 2224/27318* (2013.01); *H01L 2224/27334* (2013.01); *H01L 2224/27438* (2013.01); *H01L 2224/27848* (2013.01); *H01L 2224/2929* (2013.01); *H01L 2224/2932* (2013.01); *H01L 2224/2936* (2013.01); *H01L 2224/2938* (2013.01); *H01L 2224/2939* (2013.01); *H01L 2224/2949* (2013.01); *H01L 2224/29301* (2013.01); *H01L 2224/29305* (2013.01); *H01L 2224/29309* (2013.01); *H01L 2224/29311* (2013.01); *H01L 2224/29313* (2013.01); *H01L 2224/29314* (2013.01); *H01L 2224/29316* (2013.01); *H01L 2224/29317* (2013.01); *H01L 2224/29318* (2013.01); *H01L 2224/29324* (2013.01); *H01L 2224/29338* (2013.01); *H01L 2224/29339* (2013.01); *H01L 2224/29344* (2013.01); *H01L 2224/29347* (2013.01); *H01L 2224/29349* (2013.01); *H01L 2224/29355* (2013.01); *H01L 2224/29357* (2013.01); *H01L 2224/29363* (2013.01); *H01L 2224/29364* (2013.01); *H01L 2224/29369* (2013.01); *H01L 2224/29371* (2013.01); *H01L 2224/29373* (2013.01); *H01L 2224/29499* (2013.01); *H01L 2224/30181* (2013.01); *H01L 2224/3201* (2013.01); *H01L 2224/325* (2013.01); *H01L 2224/32145* (2013.01); *H01L 2224/32225* (2013.01); *H01L 2224/32245* (2013.01); *H01L 2224/32503* (2013.01); *H01L 2224/32507* (2013.01); *H01L 2224/8384* (2013.01); *H01L 2224/83447* (2013.01); *H01L 2224/83825* (2013.01); *H01L 2224/83856* (2013.01); *H01L 2224/83862* (2013.01); *H01L 2224/92* (2013.01); *H01L 2224/94* (2013.01); *H01L 2924/01322* (2013.01); *H01L 2924/10253* (2013.01); *H01L 2924/15747* (2013.01)

(58) Field of Classification Search
IPC .................................. 2224/05669, 2224/05673, 2224/05676, 2224/05678, 2224/00, 2224/29317, 2924/15747, 2224/8384, 2924/00, 2224/2732, 2224/2731, 2924/0012, 2224/29347, 2224/29339, 2224/29344, 2224/09369, 2224/29309, 2224/29305, 2224/29364, 2224/29355, 2924/01034, 2924/01084, 2224/05644, 2224/05663, 2924/01076, 2224/94, 2224/27, 2224/92, 21/78, 2224/83, 2224/27318, 2224/278, 2924/00012, 2224/32
See application file for complete search history.

(56) References Cited

U.S. PATENT DOCUMENTS

| | | |
|---|---|---|
| 4,802,951 A | 2/1989 | Clark et al. |
| 4,897,338 A | 1/1990 | Spicciati et al. |
| 4,921,777 A | 5/1990 | Fraenkel et al. |
| 5,043,102 A | 8/1991 | Chen et al. |
| 5,088,189 A | 2/1992 | Brown |
| 5,376,403 A | 12/1994 | Capote et al. |
| 5,463,190 A | 10/1995 | Carson et al. |
| 5,565,267 A | 10/1996 | Capote et al. |
| 5,639,556 A | 6/1997 | Gaumet |
| 5,716,663 A | 2/1998 | Capote et al. |
| 5,830,389 A | 11/1998 | Capote et al. |
| 5,853,622 A | 12/1998 | Gallagher |
| 5,922,397 A | 7/1999 | Brandt et al. |
| 5,948,533 A | 9/1999 | Gallagher et al. |
| 5,980,785 A | 11/1999 | Xi et al. |
| 6,054,761 A | 4/2000 | McCormack et al. |
| 6,068,782 A | 5/2000 | Brandt et al. |
| 6,085,415 A | 7/2000 | Gandhi et al. |
| 6,114,413 A | 9/2000 | Kang et al. |
| 6,127,619 A | 10/2000 | Xi et al. |
| 6,132,646 A | 10/2000 | Zhou et al. |
| 6,139,777 A | 10/2000 | Omoya et al. |
| 6,143,116 A | 11/2000 | Hayashi et al. |
| 6,207,259 B1 | 3/2001 | Iino et al. |
| 6,281,448 B1 | 8/2001 | Tsukamoto |
| 6,297,559 B1 | 10/2001 | Call et al. |
| 6,337,522 B1 | 1/2002 | Kang et al. |
| 6,370,013 B1 | 4/2002 | Iino et al. |
| 6,673,190 B2 | 1/2004 | Haas et al. |
| 6,716,036 B2 | 4/2004 | Gandhi |
| 6,896,172 B2 | 5/2005 | Taguchi et al. |
| 7,022,266 B1 | 4/2006 | Craig |
| 7,169,209 B2 | 1/2007 | Nakata et al. |
| 7,214,419 B2 | 5/2007 | Umeda et al. |
| 8,221,518 B2 | 7/2012 | Shearer et al. |
| 2001/0044590 A1 | 11/2001 | Ceriani et al. |
| 2002/0051728 A1 | 5/2002 | Sato et al. |
| 2002/0171157 A1 | 11/2002 | Soga et al. |
| 2003/0234074 A1 | 12/2003 | Bhagwagar |
| 2004/0217152 A1 | 11/2004 | Taguchi et al. |
| 2004/0265608 A1 | 12/2004 | Pecorini et al. |
| 2008/0023665 A1 | 1/2008 | Weiser et al. |
| 2008/0207814 A1 | 8/2008 | Wrosch et al. |
| 2009/0155608 A1 | 6/2009 | Nomura et al. |
| 2010/0230145 A1 | 9/2010 | Holcomb |
| 2010/0252616 A1 | 10/2010 | Shearer et al. |
| 2011/0171372 A1 | 7/2011 | Shearer et al. |
| 2014/0042212 A1 | 2/2014 | Shearer et al. |
| 2014/0131898 A1* | 5/2014 | Shearer et al. ............... 257/783 |

FOREIGN PATENT DOCUMENTS

| | | |
|---|---|---|
| JP | 10190159 | 7/1998 |
| JP | 3187373 | 7/2001 |
| JP | 2001326458 | 11/2001 |
| JP | 2002261105 | 9/2002 |
| JP | 4044349 | 2/2008 |
| JP | 2008038111 | 2/2008 |
| JP | 2010116453 | 5/2010 |
| JP | 4493929 | 6/2010 |
| JP | 4537555 | 9/2010 |
| JP | 4642173 | 3/2011 |
| KR | 1020050083640 | 8/2005 |
| WO | 9839105 | 9/1998 |
| WO | 9965086 | 12/1999 |
| WO | 0059645 | 10/2000 |
| WO | 2010114874 A2 | 10/2010 |
| WO | 2010114874 A3 | 10/2010 |
| WO | 2011078918 A2 | 6/2011 |
| WO | 2011078918 A3 | 10/2011 |

* cited by examiner

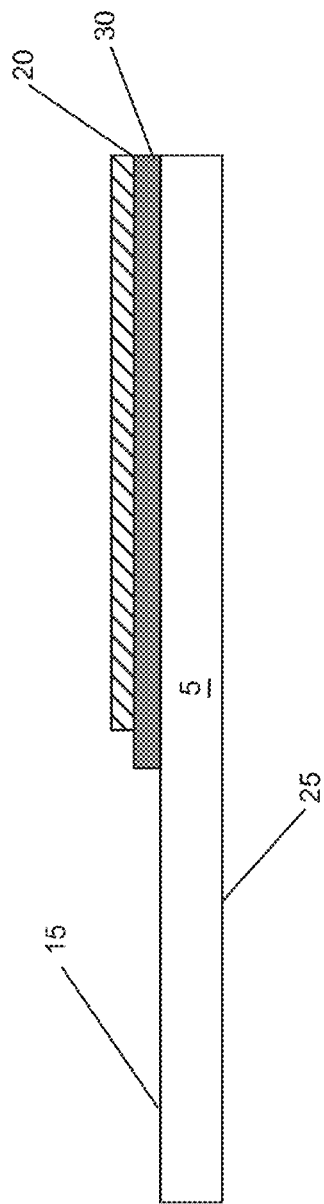
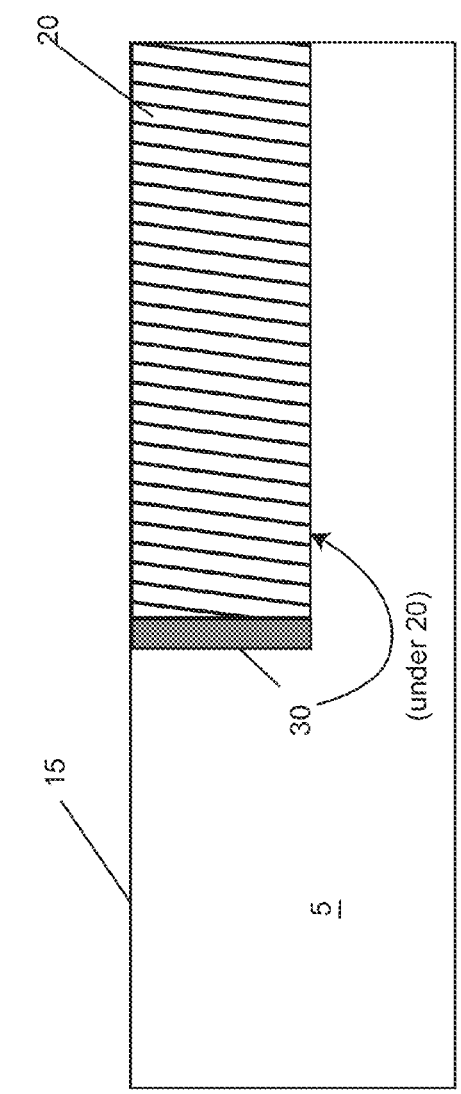

SEMICONDUCTOR PACKAGING CONTAINING SINTERING DIE-ATTACH MATERIAL

RELATED APPLICATIONS

This application claims the benefit of priority under 35 USC §119 of U.S. Provisional Application Ser. No. 61/653,272 filed May 30, 2012, the entire disclosure of which is incorporated herein by reference.

FIELD OF THE INVENTION

The present invention relates to the field of die-attach materials used in semiconductor packaging. More particularly the invention relates to semiconductor packages, and even more specifically to packages containing metallized semiconductor die attached to package elements through a metallized sintered die-attach material.

BACKGROUND OF THE INVENTION

In order for a semiconductor device to be used in an electronic product, it must be electrically, mechanically and, in some cases, thermally interconnected to a semiconductor package. Conventionally, mechanical interconnection is achieved with an adhesive material (e.g. a polymer material) in paste or film form. Electrical connection is conventionally achieved by attaching thin gold wires or tabs between the electrical outputs of the semiconductor device and the inputs of the semiconductor package. When thermal conduction is required, such as for power devices, the conventional strategy is to replace the polymer mechanical adhesive with a solder preform that is disposed between the semiconductor device and semiconductor package at the time of assembly.

There is continuous pressure to reduce cost, increase throughput and yield, and increase performance and reliability in packaged semiconductor devices. Simplification of the package is one way to achieve these goals. If a single material, applied onto a wafer rather than to individual die that are singulated (diced) from such a wafer, can be used to create the mechanical, electrical and thermal connection between the die and a package with no compromise in performance, that would be a very advantageous configuration.

Die-attach materials are used to connect semiconductor die to lead-frames, other die, heat sinks and the like. Die-attach materials are usually solders or filled polymeric materials. The fillers may be electrically conductive or non-conductive depending on the requirements of the connection. Early versions of the die-attach material primarily provided a mechanical bond; However, as semiconductor devices have advanced to more complex and powerful uses, they have become more heat-generating during operation, and thus conduction of waste heat, has become a desired features for the die-attach material. Similarly, electrical conduction can be desirable for some applications. Early die-attach materials were primarily applied by dispensing or printing operations; but as component density has increased, achieving a more controlled and consistent bond-line with a minimal fillet, than can be provided by earlier methods, has become increasingly important. Film and wafer-back-coating (WBC) die-attach materials address the challenges posed by component density increases and also reduce the yield losses that are frequently associated with application by dispensing onto singulated die. Film- and WBC-based die-attach materials also significantly improve throughput by replacing a repetitive, die-by-die operation with a single application operation at the wafer level. The primary deficiency of conventional film- and WBC-based die-attach materials is that they do not have particularly high thermal conductivity.

For high power applications, where solder is the die-attach material of choice due to its high thermal conduction, current film and WBC die-attach materials are not a viable solution. Solders, however, have some detrimental characteristics as well. One major drawback to solders is that the only choices that will not remelt during subsequent assembly operations are gold-tin and high-lead solders. Gold-tin is, of course, very expensive and lead is becoming increasingly unacceptable in electronic products due to toxicity. Further, solders have a tendency to form voids in the bond line, both during die bonding and during subsequent thermal excursions. These voids create hot spots of poor thermal conductivity under the die and increase the requirement for post-bonding inspection to ensure acceptable results.

It would therefore be advantageous to have a die-attach material that could be applied at the wafer-level like a film or paste, while having the thermal and electrical performance of a solder die-attach material (e.g. $R_{DS(on)}$ stability through multiple reflow, JEDEC L1 reliability). It would also be advantageous for a wafer-applied die-attach material to provide the superior control of bond-line size and shape that film and WBC die-attach materials offer. Further, it would be advantageous if the wafer-applied die-attach material were lead-free and did not remelt like solder during subsequent assembly steps.

Thus, there remains a need for improved materials and methods that combine the desired properties of both solder and film or WBC die-attach materials. Optimally, such materials could be applied to either or both sides of a wafer by any of a variety of process techniques; could be stored for a period of time after application and suitable initial processing, prior to die singulation and placement; are b-stageable such that after b-staging or initially processing they are substantially tack-free; would maintain a controlled bond-line thickness during die attachment; would not create large fillet areas around the die during die attachment; could be applied in a pattern on the wafer or as a continuous coating; would be lead-free; could be processed at a temperature below 260° C. and would not remelt during subsequent thermal excursions (e.g. during component assembly); and provides high and stable thermal and electrical conductance between the die and the adherend to which it is joined.

SUMMARY OF THE INVENTION

The present invention provides assemblies comprising a semiconductor wafer having a top surface and an opposing bottom surface, where at least a portion of the top surface, the bottom surface or both top and bottom surfaces is metallized with a solderable metal; and at least one b-staged, sinterable die-attach material disposed on at least a portion of the metallized portion of the wafer surface, wherein the die attach material comprises. The die-attach material contains an organic binder that includes a flux, and a means to render the flux inert as a consequence of a die-attach process; and also contains a filler comprising a mixture of metallic particles, where the mixture of particles includes at least one reactive metallic element R1 and at least one reactive metallic element R2, where R1 and R2 are capable of undergoing transient liquid phase sintering at temperature T1.

T1 can be, for example, between about 100° C. and about 300° C., and typically is between about 120° C. and about 260° C.

In certain aspects, the solderable metal covers substantially all of the top surface, the bottom surface or both top and bottom surfaces of the wafer. In other aspects, at least a portion of each of the top and bottom surfaces is metallized. When both surfaces are metallized, the solderable metal on the top surface can be the same or different than the solderable metal on the bottom surface.

Also provided are die singulated from the assembly described above, as well as assemblies of such die and at least one metallized adherend. Typically, the sinterable die-attach material is substantially non-tacky. Advantageously, the b-staged sinterable die-attach material can be tack-bonded to the metallized adherend. Subsequently, the b-staged sinterable die-attach material is sintered, to bond the die to the metallized adherend. Adherends include, but are not limited to lead-frames, laminate-based packages, ceramic-based packages, metal clips, heat sinks, and additional semiconductor die.

The b-staged, sinterable die-attach material can be, for example, a film or a paste, and in certain embodiments has a thickness between about 1 micron and about 100 microns. Film die-attach materials can be patterned to cover the metallized portion of the semiconductor wafer, and such patterning can be accomplished either before or after the film is disposed on the metallized portion of the semiconductor wafer. Paste die-attach materials can be disposed on the metallized portion of the wafer surface by any known method such as doctor blade; screen or stencil printing; and pad transfer. The paste can, for example, be a continuous coating covering substantially all of the top and bottom surfaces of the wafer, or it can selectively covers only the solderable metal on the wafer surface. The paste can be b-staged by exposure to irradiation, evolution of solvent, or a combination thereof.

In various embodiments, the b-staged, sinterable die-attach material can be a film or a paste disposed on both the top and bottom surfaces of the wafer; or a film disposed on one of the top or bottom surfaces and a paste disposed on the opposite surface. Any of the above assembly configurations and compositions can be singulated to form individualized die and further combined with other electronic components, packages, or the like.

In one aspect of the invention, an assembly is formed from one or more die containing a sinterable, b-staged die-attach of the invention on both sides, and a quad-flat no-leads (QFN) semiconductor package having a clip and a lead frame, where the die is positioned in the package assembly such that at least a portion of the b-staged, sinterable die-attach material of the die contacts the clip and the lead frame, thereby forming a mechanical, thermal and electrical connection between the clip and the lead frame when the die-attach material is sintered.

R1 can be selected from copper, silver, gold, platinum, indium, gallium, aluminum, palladium, beryllium, rhodium, nickel, cobalt, iron, molybdenum, tin and bismuth, typically copper or silver, and is most often copper. R2 can be selected from Sn, Bi, Pb, Cd, Zn, Ga, In, Te, Hg, Tl, Sb, Se, and Po, typically Sn, Bi, Zn or In, and is most often Sn.

The metallic particles can have a size between a nanoparticle and about 100 micron in diameter, and may be single metallic elements or alloys of two or more metallic elements. All or a portion of the metallic particles comprise an organic coating or a first metallic element covering a second metallic element or a non-metallic particle core. In some embodiments, the metallic particles are substantially spherical. In other embodiments, particularly particles comprising R2, at least a portion of the metallic particles are flake or platelet shaped. In other embodiments, metallic particles, have a shape selected from the group of spherical, non-spherical, or near-the metallic particles, dendritic, flake, platelet, spongiform, and combinations thereof.

The flux includes an organic acid, such as phenols, carboxylic acids, acid anhydrides, and combinations thereof, in some embodiments of the invention. In certain aspects, the flux also includes a tertiary amine, such as alkanolamine.

The means to render the flux inert as a consequence of a die-attach process can be a chemical reaction with a thermosetting resin selected from the group consisting of epoxies, novalac phenolics, cresolic phenolic, polyurethanes, polyimides, bismaleimides, maleimides, cyanate esters, polyvinyl alcohols, polyesters, polyureas and combinations thereof.

The die-attach material may further comprises a polymer, such as one selected from phenoxies, acrylics, rubbers, polyamides, polyacrylates, polyethers, polysulfones, polyethylenes, polypropylenes, polysiloxanes, polyvinyl acetates/polyvinyl esters, polyolefins, cyanoacrylates, and polystyrenes. When present, the polymer will typically have a molecular weight between about 10,000 Da and 200,000 Da.

BRIEF DESCRIPTION OF THE DRAWINGS

FIG. 1A is a side view of an assembly according to one embodiment of the invention, in which a wafer (1), having a top side (15) and bottom side (25), having metallization with a solderable metal (30) on a portion of the top side, and a having a b-staged, sinterable die-attach material (20) disposed on a portion of the metallization. FIG. 1B is a top view of the assembly shown in FIG. 1A.

DETAILED DESCRIPTION OF THE INVENTION

Definitions

Figure 2:
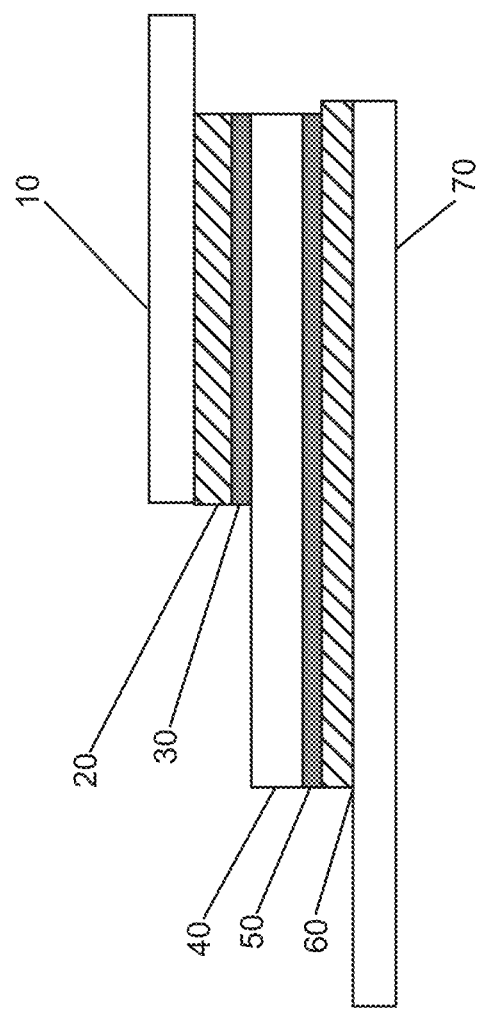
FIG. 2 shows a cross section of a clip QFN semiconductor package design.

As used herein, "or" means "and/or" unless stated otherwise. Furthermore, use of the term "including" as well as other forms, such as "includes," and "included," is understood as "comprising" and is not limiting. It is to be understood that as used in the specification and in the claims, the singular form of any word can also refer to the plural, depending upon the context in which it is used. For example, "a" or "an" can mean one or more, depending upon the context in which it is used. Thus, reference to "a metal" can mean at least one metal, two metals, or a plurality of metals.

"About" or "approximately" as used herein, means that a number referred to as "about" or "approximately" comprises the recited number plus or minus 1-10% of that recited number. For example, about 50 degrees can mean 45-55 degrees or as few as 49-51 degrees depending on the situation. Whenever it appears herein, a numerical range, such as "45-55", refers to each integer in the given range; e.g., "45-55%" means that the percentage can be 45%, 46%, etc., up to and including 55%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

As used herein, the term "substantially" refers to a great extent or degree. For example, "substantially all" typically refers to at least about 90%, frequently at least about 95%, often at least 99%, and more often at least about 99.9%.

The term "alloy" refers to a mixture containing two or more metals, and optionally additional non-metals, where the elements of the alloy are fused together or dissolved into each other when molten. The notation used herein for alloy compositions lists two or more elements using their IUPAC symbols separated by a forward slash ("/"). When given, the proportions of the elements in the alloy are indicated by subscripts corresponding to the weight percent of the element in the alloy. For example, Sn/Bi represents an alloy of tin (Sn) and bismuth (Bi), which can be any proportion of these two elements. $Sn_{60}/Bi_{40}$ represents a specific alloy of tin and bismuth that contains 60 percent by weight of tin and 40 percent by weight of bismuth. Where a range is given for the weight percent of an element(s) in an alloy, the range indicates that the element can be present in any amount within the indicated range. For example, $Sn_{(70-90)}/Bi_{(10-30)}$ refers to an alloy containing from 70 weight percent to 90 weight percent of tin, and from 10 weight percent to 30 weight percent of bismuth. Thus, alloys encompassed by the "$Sn_{(70-90)}/Bi_{(10-30)}$" range include, but are not limited to: $Sn_{70}/Bi_{30}$, $Sn_{71}/Bi_{29}$, $Sn_{72}/Bi_{28}$, $Sn_{73}/Bi_{27}$, $Sn_{74}/Bi_{26}$, $Sn_{75}/Bi_{25}$, $Sn_{76}/Bi_{24}$, $Sn_{77}/Bi_{23}$, $Sn_{78}/Bi_{22}$, $Sn_{79}/Bi_{21}$, $Sn_{80}/Bi_{20}$, $Sn_{81}/Bi_{19}$, $Sn_{82}/Bi_{18}$, $Sn_{83}/Bi_{17}$, $Sn_{84}/Bi_{16}$, $Sn_{85}/Bi_{15}$, $Sn_{86}/Bi_{14}$, $Sn_{87}/Bi_{13}$, $Sn_{88}/Bi_{12}$, $Sn_{89}/Bi_{11}$, and $Sn_{90}/Bi_{10}$. Furthermore, $Sn_{(70-90)}/Bi_{(10-30)}$ represents alloys in which the specific proportion of the elements Sn and Bi may vary from $Sn_{70}/Bi_{30}$ to $Sn_{90}/Bi_{10}$ inclusive of proportions of Sn varying from 70 up to 90 weight percent and Bi inversely varying from 30 down to 10 weight percent.

"Flux" as used herein, refers to a substance, often an acid or base, used to promote fusing of metals and in particular, removes and prevents the formation of metal oxides.

The terms "melting temperature" or "melting point," as used herein, refer to the temperature (a point) at which a solid becomes a liquid at atmospheric pressure.

The terms "high melting temperature metal", "high melting point metal" or "HMP metal" as used herein, refer to a metal having a melting temperature that is equal to, or higher than, about 400° C. HMP metals include Cu, Ag, Pd, Au, Al, Ni, Be, Rh, Co, Fe, Mo and Pt. Typically, the HMP metal used in the compositions of the present invention is Cu, Ag, Pd, Au, Al, Ni or Pt, and most frequently the HMP metal is either Cu or Ag.

The terms "low melting temperature metal", "low melting point metal" or "LMP metal" as used herein, refer to a metal having a melting temperature that is lower than about 400° C. Exemplary LMP metals include Sn, Bi, Zn, Ga, In, Te, Hg, Tl, Sb, Se, Po, Pb, Cd, and Po and alloys comprising these metals. Typically, the LMP metal used in the compositions of the present invention is Sn, Bi, Pb, Ga, In or Zn, and most frequently the LMP metal is a non-eutectic alloy of Sn.

The term "solidus" refers to the temperature below which a given substance is completely solid (crystallized). The solidus quantifies the temperature at which melting of a substance begins, but is not necessarily melted completely, i.e., the solidus is not necessarily a melting point. For this distinction, the solidus may be contrasted to the "liquidus", which specifies the maximum temperature at which crystals can co-exist with molten substance. Above the liquidus temperature the material is homogeneous and liquid at equilibrium. Below the liquidus temperature more and more crystals may form. The solidus and liquidus temperatures do not align or overlap in all cases. If a gap exists between the solidus and liquidus temperatures, it is called the "freezing range" or "mush range", and within that gap, the substance consists of a mixture of solid and liquid phases.

The term "differential scanning calorimetry" ("DSC") refers to a method of thermal analysis in which the difference in the amount of heat required to increase the temperature of a sample and reference are measured as a function of temperature. DSC is used to investigate the melting behavior of non-eutectic alloy particles and the reaction signature of TLPS pastes formulated with eutectic vs. non-eutectic alloys.

The term "sintering" refers to a process in which adjacent surfaces of metal powder particles are bonded by heating. "Sinterable" refers to materials that can be sintered. "Liquid phase sintering" refers to a form of sintering in which the solid powder particles coexist with a liquid phase. Densification and homogenization of the mixture occur as the metals diffuse into one another and form new alloy and/or intermetallic species.

In "transient liquid phase sintering" or "TLPS", the liquid phase exists for a only short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above the solidus temperature of the HMP metal.

"Solder" is a fusible metal alloy used to join together metal parts and having a melting point below that of the workpiece(s). Thus, solder is typically an alloy or combination of alloys of one or more LMP metals. Solder has a characteristic melting behavior that does not change substantially with repeated heat/cool cycles. Solder can include eutectic or non-eutectic alloys, but eutectic alloys are generally preferred for joining applications because the joints solidify quickly. TLPS differs from solder due to the presence of a HMP metal in TLPS compositions, which interact with a reactive LMP metal in the TLPS low melting temperature alloy to form crystalline intermetallics with specific stoichiometric proportions and much higher melting temperatures than the original TLPS composition. Thus, TLPS compositions generally do not remelt at the original process temperature. Although intermetallics can form within solder and between solder and elements in joined surfaces (e.g. copper pads), they represent only a small proportion of the soldered joint (<5%). Therefore, applied solder can be remelted under substantially the same conditions as the original application.

The "Coefficient of Thermal Expansion" or "CTE" is a term of art describing a thermodynamic property of a substance. The CTE relates a change in temperature to the change in a material's linear dimensions. As used herein "$\alpha_1$ CTE" or "$\alpha_1$" refers to the CTE before the $T_g$, while "$\alpha_2$ CTE" refers to the CTE after the $T_g$.

The term "processing temperature" or "$T_1$" as used herein in reference to TLPS compositions is a temperature at which two reactive metals (e.g. Cu and Sn) form intermetallic species.

The terms "intermetallics" or "intermetallic species" refer to a solid material, which is comprised of two or more metal atoms in a certain proportion, that has a definite structure which differs from those of its constituent metals.

"Semiconductor wafer" or "wafer" (also called a slice or substrate), as used herein, refers to a thin slice of semiconductor material, such as a silicon crystal, used in the fabrication of integrated circuits and other electronic devices. The wafer serves as the substrate for microelectronic devices that are built in and over the wafer, and can involve many optional microfabrication process steps such as doping or ion implantation, etching, deposition of various materials, and photolithographic patterning.

Finally the individual microcircuits are separated ("singulated") by dicing to form individual units known as "semiconductor die" or "die", and can be packaged. In some cases, the wafer is diced into die with minimal processing. "Die", "semiconductor device", "semiconductor die" and "semiconductor chip" are used interchangeably in reference to the individual device units formed when a semiconductor wafer is sliced, or "singulated."

"Electronic component" or "component" as used herein, refers to the basic, discrete devices or physical units in an electronic system that are used to affect electrons or their associated fields. Electronic components are typically available in a singular forms, including but not limited to diodes, transitors, rectifiers, resistors, capacitors, inductors and the like.

The terms "semiconductor package" or "package" are used interchangeably to refer to unit containing one or more semiconductor electronic components, that are interconnected and the partially or fully coated or encased in a metal, plastic, glass, or ceramic casing. Individual, discrete components are typically etched in silicon wafer before being cut and assembled in a package. The package provides protection against impact and corrosoion, holds the contact pins or leads, which are used to connect external circuits to the package device or devices, and dissipates heat produced in the device.

"Solder preform" as used herein, refers to a shaped piece of a solder alloy placed between one electronic device and a device package and reflowed in order to create a mechanical bond that is also electrically and thermally conductive.

"Wirebonding" or "wire bonding", is the process of providing electrical connection between the silicon chip (die) and the external leads of a semiconductor device using very fine bonding wires. The wire used in wirebonding is usually made either of gold (Au), aluminum (Al), or Cu. There are two common wirebonding processes: ball bonding and wedge bonding "Die-attach adhesive": A mechanical bond is formed by attaching the die to the semiconductor package substrate with the use of a polymer glue. A drop of polymer is dispensed on the package and the die placed on top of it. The package needs to be heated at an elevated temperature to cure the polymer properly. This process uses adhesives such as polyimide, epoxy and silver-filled glass as die-attach material to mount the die on the die pad. The mass of polymer climbing the edges of the die is known as the die-attach fillet. Excess of die-attach fillet results in the die-attach contamination of the die surface and little amount used may result in die lifting or die cracking Polymer adhesives are electrical insulators and have poor thermal conductivity. To improve the electrical conductivity, epoxy or polyimides are filled with the gold and silver material. In order to achieve a lower value of thermal resistance ceramic particles like SiC (Silicon carbide, compound of silicon and carbon) and BeO (Beryllium oxide, an inorganic compound) are added. Polymer bonding is mainly preferred due to its low curing temperature, can be used for wide range of die sizes.

"Film die-attach adhesive" or "DAF": film die-attach adhesives are polymer adhesive formulations, sometimes with fillers, that are cast as a film that is applied to a semiconductor wafer prior to singulation into individual devices. Film die-attach adhesives offer the advantages of a better-controlled bond-line between the die and semiconductor substrate and application to the entire wafer rather than singulated die.

"b-staged" or "b-stage" refers to a state of the sintering die-attach material of the invention in which it is stable and non-tacky but has not yet undergone the sintering reaction of the metallic constituents. As used herein, "B-stageable" refers to the properties of a die-attach material that is used to join two surfaces, such as the surface of a die and a lead frame, in which the material has a first stage in which the material can be applied to a first surface, stored and initially process (e.g. heated) to join initially join the first surface to the second surface. The die-attach material (e.g. a paste or film) can be applied to a surface and preferably dried or processed to a non-tacky stage suitable for storage in the "b-stage". The applied die-attach material will typically adhere to another surface, such as an adherend, to provide temporary or light bonding of two surfaces to each other. Finally, the die-attach material is processed (e.g., at elevated temperature) to further set and solidify the material, thereby forming a strong bond. In a conventional b-stageable die-attach material containing polymeric adhesives, the first stage is thermoplastic and therefore the die-attach material applied to a first surface can be remelted to attach the first surface to a second surface. Upon further processing, the polymer-based die-attach material becomes fully cured to a thermoset, which does not melt upon further heating.

Similarly, the sinterable, b-stageable die-attach materials of the invention will typically have a first stage in which the material is applied to a first surface, followed by processing or reacting the components of the die-attach material, and thereafter is non-tacky and suitable for storage. A b-staged die can be subsequently contacted with an adherend and the two surfaces tack-bonded to form an initial positioning of the die and the adherend. Finally, the tack-bonded assemble is processed at higher temperature to sinter the metals in the sinterable die-attach material, thereby forming a bond that is not subject to re-melting, and which is thermally, electrically and mechanically stable.

The present invention provides sinterable die-attach materials that have solder-like electrical and thermal performance, and are stable because they do not change or remelt during subsequent thermal processing (e.g., during component attachment to a circuit board) Significantly, the sinterable die-attach materials of the invention can be applied at the wafer level and subsequently, individual die can be singulated (sliced, diced, or cut) from the b-staged wafer assembly for use in various downstream applications.

The present invention thus provides assemblies of semiconductor wafers having a sinterable die-attach material of the invention disposed on at least one side. Referring to FIGS. 1A and 1B, which illustrate an embodiment of an assembly (1) according to the invention, the wafer (5) is a thin sheet of semiconductor material (e.g. silicon crystal), and thus has a predominant top surface (15) and a predominant bottom surface (25). In the b-staged invention assembly, at least a portion of the top surface or bottom surface (15, 25) is metallized with a solderable metal. In various embodiments, all or only a portion of top surface is metallized. In other embodiments, all or only a portion of the bottom surface is metallized. In yet further embodiments, both surfaces are metallized either fully or partially. For example, the top surface may be fully metallized such that the substantially the entire top surface is covered with a solderable metal, while the bottom surface is only partially metallized. In yet further embodiments, both the top and bottom surfaces are fully metallized.

Metallization of wafers is well known in the art and metallized wafers can be purchased commercially or prepared using standard methodology. Suitable solderable metals include, but are not limited to copper and noble metals (e.g. gold, platinum, silver, palladium, rhodium, osmium, iridium, and ruthenium). When both the top and bottom surfaces are metallized, the solderable metals on each of the surfaces can be the same or different metals. For example, the top surface may be metallized with silver while the bottom surface is metallized with gold. Also contemplated is metallization with more than one metal on one or both surfaces, such as where a portion or area of the top surface is metallized with gold and a different portion or area of the top surface is metallized with silver. Further, the metallization of all or a portion of either surface can include a mixture of metals, such as mixture of two or more metals selected from gold, silver, platinum, indium, palladium, rhodium, osmium, iridium, ruthenium and copper).

The embodiment illustrated in FIGS. 1A and 1B shows a top wafer surface that is partially metallized. Disposed on at least a portion of the metallization (30), is a b-staged or b-stageable, sinterable, die-attach material (20). The b-stageable, sintering die-attach material may be applied to either one or both sides of the wafer and may be patterned or a continuous coating.

After b-staging, individual die can be cut from the assembly and tack-bonded to a metallized adherend. Thus, the present invention also provides die assemblies comprising a sinterable, b-staged die-attach material and die assemblies in which the die is tack-bonded to an adherend, and subsequently sintered to form a high performance bond between the die and metallized adherend. Installation of the structures of the invention into a semiconductor package produces semiconductor packages that offer superior electrical and thermal conductivity, more thermally robust mechanical characteristics, and superior bond-line and fillet geometry control to prior art alternatives.

In one embodiment, assemblies of the invention include:
a) a semiconductor wafer having a top surface and an opposing bottom surface, wherein at least a portion of the top surface, the bottom surface or both top and bottom surfaces is metallized with a solderable metal;
b) at least one b-staged, sinterable die-attach material disposed on at least the metallized portion of the wafer surface, wherein the die attach material comprises:
 i) an organic binder comprising:
  (1) a flux, and
  (2) a means to render the flux inert as a consequence of a die-attach process; and
 ii) a filler comprising a mixture of metallic particles, wherein the mixture of particles comprises at least one reactive metallic element R1 and at least one reactive metallic element R2, wherein R1 and R2 are capable of undergoing transient liquid phase sintering at temperature T1.

In the use of the invention structures the semiconductor wafer bearing the b-staged sinterable, die-attach material is singulated into individual die. The individual die, each bearing the b-staged sintering die-attach material are then bonded to a metallized adherend in a semiconductor package. The sintering reaction between the metal particles in the sintering die-attach material also extends to the metallization on the die and the adherend, thus forming a continuous sintered bond.

The adherend may be any element of a semiconductor package that can be directly bonded and potentially electrically interconnected to the semiconductor die. Examples of adherends contemplated for use include be lead-frames, laminate substrates, ceramic substrates, metal clips or tabs, heat sinks, semiconductor die and the like. Skilled artisans will appreciate that b-staged and b-stageable, sinterable die can be advantageously be bonded by sintering into a variety of semiconductor package configurations assembled in various sequences and by various methods.

In more complex electronic components in which semiconductor die are installed in a stacked configuration, application of the invention wafer-applied die-attach material to both sides of wafer is particularly advantageous. The clip quad-flat-pack-no-leads (clip QFN) package design is an exemplary die-attach application that will benefit significantly from a high-performance, wafer-applied die-attach material. In this particular package configuration, illustrated in FIG. 2, the benefits of such a material could potentially be leveraged two-fold by wafer-level application of the die-attach material on both sides of the semiconductor wafer.

With reference to FIG. 2, the upper copper clip of the clip QFN semiconductor (10) is attached to a screen-printed b-stageable sinterable die-attach material (20) that was pre-applied to upper die metallization (30). The upper metallization (30) on the die (40) does not cover the entire die surface, hence the need for patterning of the die-attach material. A patterned film die-attach material would also be suitable for this joint.

On the bottom side of die (40) the entire surface is metallized with a solderable metal (50). The sinterable die-attach material (60) would be pre-applied to the semiconductor wafer from which die (40) was singulated prior to placement onto lead (70). The die-attach material (60) may be applied as either a continuous film or b-stageable coating.

The process for constructing the clip QFN semiconductor package depicted in FIG. 2 is thus to apply the die-attach material to the fully metallized side of the wafer as either a film or b-stageable paste; apply a patterned film or screen-print a b-stageable paste form of sinterable die-attach material onto the opposing side of the wafer with the patterned metallization; singulate the semiconductor die from the wafer by any means known to those of skill of the art; place the die (40), bearing the sinterable die-attach material of the invention on either side (20, 60), onto the lead (70) by any means known to Skilled artisans; affix the upper lead (10) to the patterned material (20) by any means known to Skilled artisans; subjecting the construction thus formed to a thermal excursion sufficient to sinter the sinterable die-attach material (20, 60) to effect the mechanical connection and the thermal and electrical interconnection of the assembly.

It will be understood by those skilled in the art that the foregoing description of the assembly method for the construction depicted in FIG. 2 could be achieved by a variety of alternative means. The described method has the advantage of maximally leveraging the yield and productivity improvements afforded by wafer-level application of the sinterable die-attach material to both sides of the semiconductor wafer. One example in which it might not be advantageous to apply invention sinterable die-attach material to both sides of the semiconductor wafer prior to dicing would be when the die is very thin. In this instance, it would be impractical to handle a wafer that is the thickness of the final die. In such an application, it may be advantageous to apply the die-attach material of the invention to one side of the wafer, dice through a partial thickness of the wafer, and then grind the wafer on the side opposing the die-attach material to achieve die of the final desired thickness.

It will also be appreciated by those skilled in the art that the hybrid solder-adhesive nature of the b-stageable, sinterable die-attach material when pre-applied to the backside of the wafer in the production of one embodiment of invention constructions confers considerable advantage over either solder or non-sinterable pre-applied adhesives. Whether applied to the back (unpatterned) side of the wafer, the front (patterned) side of the wafer or both sides, the sinterable die-attach material confers significant performance, reliability and yield advantages to the invention structures. These advantages are realized whether the sinterable die-attach material replaces solder or other prior art die-attach materials at just one interface within the invention structures or when it is a replacement material at multiple interfaces.

The variety of methods and formats by which invention structures may be constructed enables the practitioner to make best use of the advantages of wafer-level application. An exemplary case is the application of die-attach material to both sides of a semiconductor wafer with one side patterned and the other side not patterned, for inclusion in a clip QFN package. This type of structure is depicted in FIG. 3.

Figure 3:
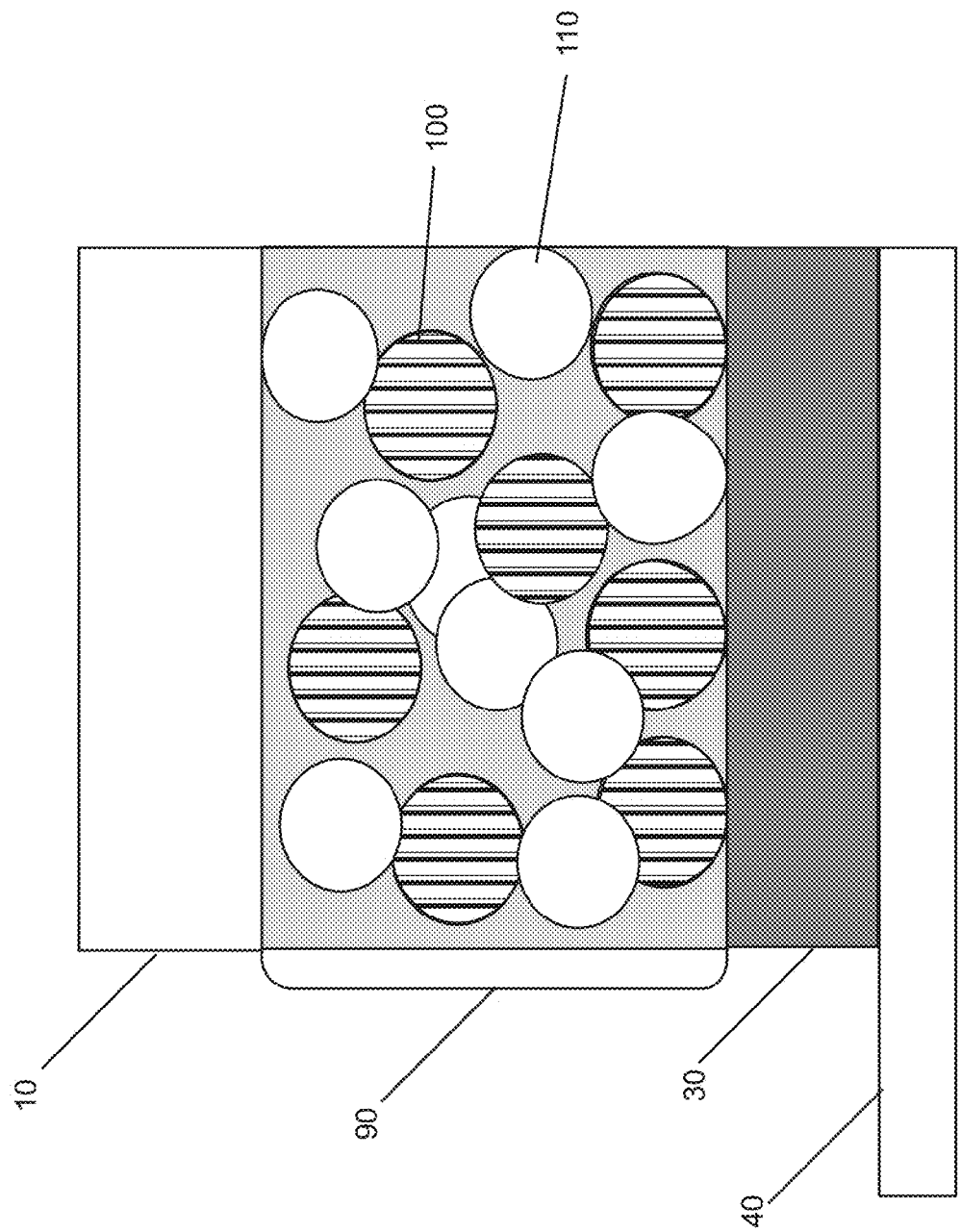
FIG. 3 shows an expanded cross section of a die-attach joint.

FIG. 3 shows an expanded cross section of a die-attach joint. between the upper lead (clip) (10) of FIG. 2 and the patterned metallization (30) of the die (40). In this figure, the sinterable die-attach material of the invention (90) is disposed between clip (10) and the patterned metallization (30) in its film or b-staged form prior to sintering. Substantially spherical particles comprising reactive metal R1 (110) and substantially spherical particles comprising reactive metal R2 (100) are dispersed in an organic binder.

Figure 4:
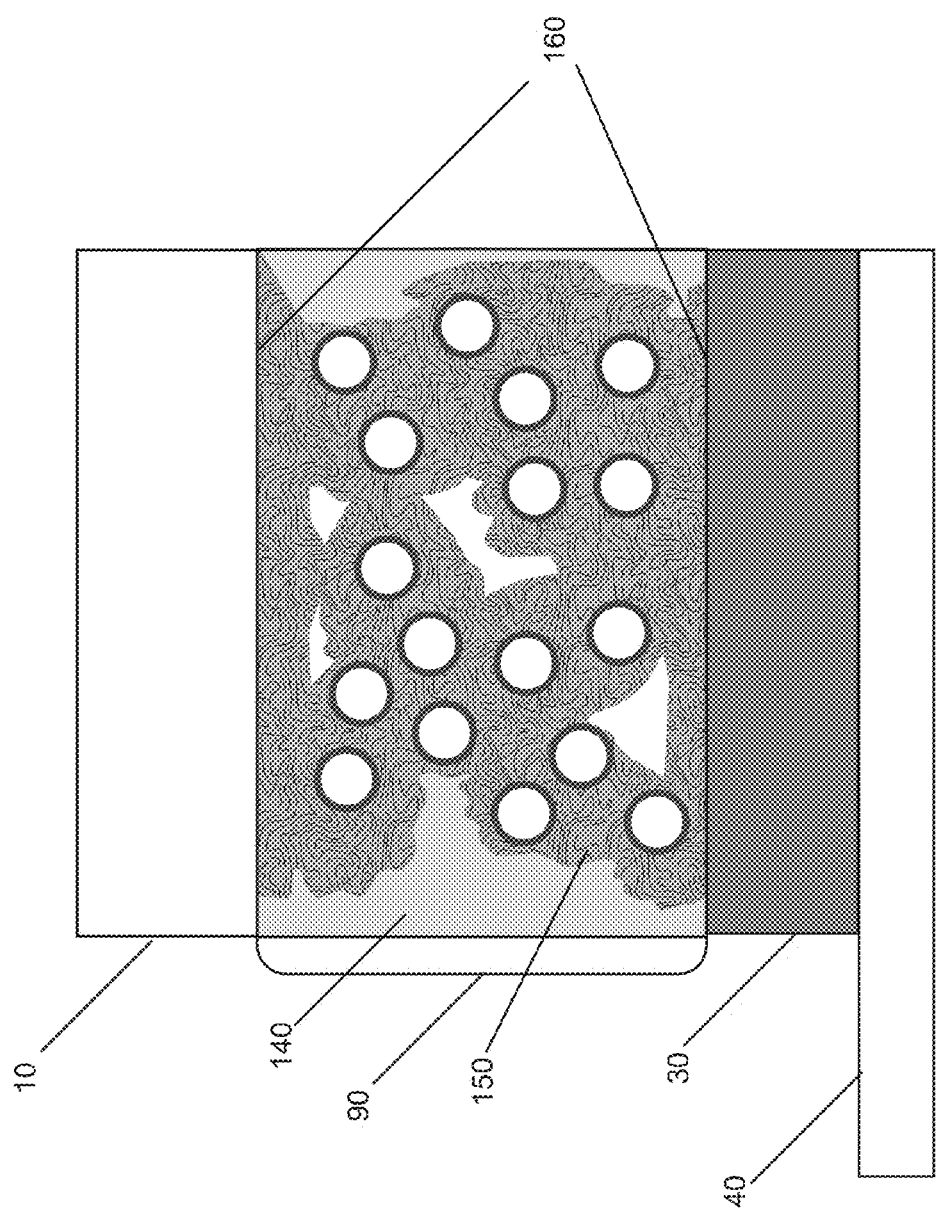
FIG. 4 depicts the same cross section as FIG. 3 after a thermal excursion.

FIG. 4 depicts the same cross section as FIG. 3 after a thermal excursion sufficient to effect the sintering reaction between R1 and R2. Particles (100, 110) containing the reactive metals R1 and R2 have reacted to form an interconnected matrix of intermetallics and residual particle cores (150) surrounded by a permanent residual organic phase (140). Particles (100) comprising reactive metal R2 have also reacted with the clip solderable metallization (10) and the solderable metallization (30) on the die (40) to form a metallurgical interconnection (160) between the invention die-attach material and these surfaces (10, 30).

Preparation of Assemblies

The sinterable die-attach material is applied to either one or both sides of a semiconductor wafer as a film (patterned or unpatterned), or as a b-stageable paste by any suitable method, including but not limited to laminating, dispensing, jetting, screen-printing, stencil-printing, doctor-blading, and pad transfer.

b-Stageable Pastes and Films

When formulated as a paste, the wafer-applied sinterable, die-attach material further comprises components that facilitate processing of the deposited paste to a tack-free coating. The process of converting the deposited paste to a tack-free coating is called "b-staging" and pastes that can be partially processed in this manner are called "b-stageable pastes." After the b-stage process, the coating is still capable of forming a sintered joint in a subsequent processing step. b-staging can be accomplished, for example, by incorporation of a suitable catalyst into the paste and exposing the paste to radiation of an appropriate wavelength after application to the wafer. Alternative b-staging strategies including evaporation of a fugitive solvent, or other traditional b-staging strategies, are known in the art. The paste may be applied as a continuous coating or in a pre-defined pattern. Exemplary methods of applying a patterned coating include dispensing, jetting, pad transfer, screen- and stencil-printing.

Typically, sinterable die-attach pastes according to the invention are prepared by mixing organic constituents and metal powders in appropriate proportions to achieve a flowable paste that will form a bead and roll across a screen or stencil when pushed by a squeegee blade, and can be b-staged as described above. Additives such as surfactants, antifoams, diluents, tackifiers, rheology modifiers and the like may be incorporated to achieve a paste having suitable physical properties such as consistency.

The sinterable die-attach material may also include one or more polymers. In certain aspects of the invention, such polymer(s) will aid in the formation of films that can be applied to a wafer in film form. The polymer is the basis for the ease of use and handling provided by the film form of the invention. The polymer may be any that is useful for creating a conductive film material that can be easily handled and that is compatible with the remainder of the conductive film material composition. Examples of suitable polymer materials include, but are not limited to: phenoxies, acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates, polystyrenes, and the like. Polymers with a molecular weight in the range of 10,000-200,000 Da are particularly suitable for both handling and incorporation into the varnish. In certain aspects of the invention, is the polymer is preferable a phenoxy resin. Typically, the polymer will be present at between about 1 and about 10 weight percent of the conductive film material.

Typically, the sintering die-attach film of the invention is manufactured by first formulating a varnish that can be cast on a carrier substrate. Casting of the varnish may be accomplished by any suitable method such as screen printing, stencil printing, doctor blading, curtain coating, spraying, extruding and the like. The varnish will typically incorporate a fugitive solvent to facilitate the casting operation. Once the varnish has been cast on the carrier substrate, the solvent is typically removed by drying. The die-attach film thus created is then ready for use, or, depending on the specific formulation or application, may undergo further processing to render it suitable for use. In one embodiment of the invention, one layer of conductive film material is inverted over another and the two film layers are laminated together to form a single film having a more homogeneous distribution of metallic particles than single layer films.

With either the paste or film form of the die-attach material, the invention semiconductor package assemblies derive their superior attributes from the metallic matrix formed during the die-attach process that is continuous from the solderable die metallization, through the thickness of the die-attach material, and to the solderable metallization of the adherend. This matrix is formed as the material is heated and the particles containing reactive metal element R1 (e.g. copper) react with the particles containing reactive metal element R2 (e.g. tin) to form interconnected intermetallic (e.g. $Cu_6Sn_5$ and $Cu_3Sn$) and residual alloy structures. The intermetallic structures formed from R1 and R2 have melting temperatures in excess of 300° C. The continuous metallic matrix thus formed is robust in adverse environmental conditions, does not remelt during subsequent operations such as solder reflow, provides strong mechanical adhesion, and provides a continuous thermal and electrical pathway from the die to the adherend.

Metallic Components of Sinterable Die-Attach Materials

A mixture of metallic particles or powders provides the sinterable component of the invention die-attach materials. The metallic particles are formulated to undergo transient liquid phase sintering during thermal processing to create superior electrical and thermal conduction pathways. Sintering is a process wherein adjacent surfaces of metal powder particles are bonded by heating. Liquid phase sintering is a special form of sintering wherein the solid powder particles coexist with a liquid phase. Densification and homogenization of the mixture occur as the metals diffuse into one another and form new alloy and/or intermetallic species.

In transient liquid phase sintering (TLPS) of powders/particles, the liquid phase only exists for a short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above its equilibrium melting temperature.

Suitable combinations of metallic particles are described in U.S. Pat. No. 8,221,518, issued Jul. 17, 2012; U.S. Patent Application Publication No. 2011-0171372, filed Nov. 5, 2010; and U.S. patent application Ser. No. 13/732,308, filed Dec. 31, 2012, the contents of which are incorporated by reference herein in their entireties.

The die-attach materials of the invention include a metallic filler component that includes a mixture of metallic particles, that comprises at least one reactive metallic element $R1$ and at least one reactive metallic element $R2$, wherein $R1$ and $R2$ are capable of undergoing transient liquid phase sintering at temperature $T1$. Reactive metallic element $R2$ (e.g. Sn) and reactive metallic element $R1$ (e.g. Cu or Ag) contained within the mixture of metallic particles undergo transient liquid phase sintering at $T1$ to form new alloy compositions and/or intermetallics. $T1$ is typically in the range of 120-260° C. The diffusion and reaction of the reactive metals(s) $R2$ and $R1$ continues until the reactants are fully depleted, there is no longer a molten phase at the process temperature, or the reaction is quenched by cooling the mixture. After cooling, subsequent temperature excursions, even beyond the original melt temperature, do not reproduce the original melt signature of the mixture. This is the signature of a typical low temperature transient liquid phase sintered (hereinafter "TLPS") metal mixture. The number and nature of the new alloy and/or intermetallic species formed is dependent on the selection of metallic constituents, their relative proportions, the particle size distribution and the process temperature. The composition of the residual components of the original reactive metal $R2$ and alloys thereof is likewise dependent on these factors.

The microstructure of processed TLPS compositions appears as a network of particles of high melting temperature metal bearing one or more 'shells' of the newly formed alloy/intermetallic compositions and interconnected by the non-reactive portion of the original low melting temperature alloy. Open areas of the network structure are generally filled with the cured polymeric binder.

In certain embodiments, reactive metal $R1$ is copper or a noble metal, although some alternatives may be useful in specific applications. Copper is relatively inexpensive, plentiful, compatible with the metallurgy typically used for circuit elements, possesses a melting temperature in excess of 1000° Celsius, is ductile, is readily available in a variety of powder forms, and is an excellent electrical and thermal conductor. Silver, gold, platinum, indium and gallium are also specifically contemplated for use in the invention compositions, such as in applications in which copper particles would be vulnerable to subsequent manufacturing processes (e.g. copper etching), or in cases in which the use of a noble metal would substantially increase the net metal loading by reducing the need for flux. In some applications, aluminum, palladium, beryllium, rhodium, nickel, cobalt, iron, molybdenum, tin and bismuth could be alternative choices contemplated for use in the die-attach materials employed in the invention structures.

The metallic particles containing $R2$ may be any combination of elements or alloys of Sn, Bi, Pb, Cd, Zn, Ga, In, Te, Hg, Tl, Sb, Se, Po, or another metal or alloy having a constituent element that is reactive with the metallic element $R1$. $R2$-containing particles may be identical in shape, size and composition or they may be a mixture of different types of particles. The principal requirement of the particles containing $R2$ is that some portion of it becomes molten at the process temperature $T1$ to render the full complement of reactive species within the alloy $R2$ containing particles available for reaction with the reactive metal(s) $R1$ prior to vitrification of any polymers in the composition. Alloys of Sn, particularly with Bi, are suitable for most embodiments of the invention.

The use of additional reactive metal(s) in combination with $R1$ is also contemplated in order to obtain TLPS reaction products with optimal characteristics for each invention assembly. Optional metal additives can be added as separate particles, as a coating on the reactive metal $R1$ or one of the reactive metal $R2$ or alloys thereof, or pre-alloyed with $R1$, $R2$ or alloys of either reactive metal. In certain embodiments, the particulate additives range in size from nanoparticles to about 20 μm. The metal additive can be one or more metals chosen from the group consisting of boron, aluminum, chromium, iron, nickel, zinc, gallium, silver, palladium, platinum, gold, indium, antimony, bismuth, tellurium, manganese, phosphorous and cobalt. In the conductive compositions described herein, the TLPS reaction allows the reactive metal $R1$ and the reactive metal $R2$ and alloys thereof to form a metallurgically connected matrix. Without wishing to be bound by a particular theory, it is believed that additive metals alter the grain structure, extent of interdiffusion, and rate of formation of the matrix formed between $R1$ and $R2$ during processing of invention TLPS compositions. It is further believed these structural alterations provide a wide variety of benefits to the composition that may be selected to tailor the formulations to specific requirement, such as promoting greater flexibility and the like. Typically, the metal additive is selected from silver, nickel, gallium and gold.

The metallic particles comprising reactive metallic elements $R1$ and $R2$ may be introduced into invention sintering die-attach material compositions in a wide variety of forms. The particles may be of a single metallic element or may be alloys or two or more elements. The particles may be spherical, non- or near-spherical, dendritic, flake, platelet, spongiform or the like. The particles may have one metallic element coated onto another, or the metallic element may be present as a coating on a non-metallic particle core. Dopants (e.g. boron) may be added to the metallic particles to retard oxidation or organic coatings (e.g. saturated or unsaturated fatty acids) may be applied to the metallic particles to retard oxidation or facilitate incorporation into the varnish. Spherical metallic particles and mixtures of spheres and flakes in the size range of 1-100 micron in diameter are presently preferred. In certain embodiments, the particles contain a mixture of metallic particles substantially comprising Cu or Ag, with metallic particles substantially comprising alloys of Sn. An organic coating on the particles is presently considered advantageous for embodiment utilizing Cu or Ag particles. The ratio of the substantially Cu or Ag particles to Sn alloy particles is typically in the range of 0.3 to 3, by weight, such as 0.5:1, 0.75:1, 1:1, 1.25:1, 1.5:1, 1.75:1, 2:1, 2.25:1, 2.5:1, 2.75:1, 2.9:1 or 3:1 The total weight percentage of metallic particles in invention die-attach material is in the range of 75-98%.

Metallic Particle Size and Shape

Introduction of the particles into the die-attach material as a mixture of sizes and shapes may facilitate characteristics such as thixotropy, efficient or homogeneous particle packing, and the development of a strong and highly conductive metal matrix by the TLPS reaction. The incorporation of some particles as platelets or flakes may increase the number of particle contacts and thus facilitate the TLPS reaction between R1 and R2 in adjacent particles. See for example, Experimental EXAMPLE 2, below. Further, it may be advantageous to introduce the particles containing R2 as platelets or flakes rather than the particles containing R1. Platelets and flakes will have a larger surface area than the equivalent weight of spherical particles. This increased surface area results in a higher proportion of oxides per weight of particles. Because the particles containing R2 melt during the TLPS reaction, the oxide layer becomes broken by the molten metal. In the particles containing R1, any oxide that forms must be removed by the flux for the TLPS reaction to occur. Thus, introducing the particles containing R1 to the die-attach material as flakes places a higher burden on the flux and is less advantageous.

Flux

The flux component of the invention die-attach materials serves to clean the surfaces of the metallic particles in order to facilitate the TLPS reaction. Materials contemplated for use as fluxes include carboxylic acids, inorganic acids, alkanolamines, phenols, rosin, chloride compounds and salts, halide compounds and salts, and the like. A key element of the invention compositions is that the flux is rendered inert at the conclusion of thermal processing of the material joint. Typically, a thermosetting resin is incorporated to react with the functional groups of the flux to render it inert and immobile. Presently preferred flux materials for the invention compositions are alkanolamines, carboxylic acids, phenols and mixtures thereof. Most preferred are mixtures or salts of carboxylic acids and tertiary amines due to their synergistic flux activity and latency in the presence of the thermosetting resin.

Typically, the level of addition of a carboxylic acid, carboxylic acid-tertiary alkanolamine mixture or salt flux is about 0.1-about 8% by weight in the invention die-attach material.

In some embodiments, the means for inerting the flux is to incorporate a thermosetting resin that is reactive with functional groups in the flux molecule(s) and thus rendering the flux immobile. The thermosetting resin may be any species that can react with and effectively immobilize the carboxylic acid functional groups. Species that meet this requirement include, but are not limited to, epoxies, phenolics, novalacs (both phenolic and cresolic), polyurethanes, polyimides, bismaleimides, maleimides, cyanate esters, polyvinyl alcohols, polyesters and polyureas. Other species may be modified to be reactive with the carboxylic acid or phenol bearing moieties. Examples of such species are acrylics, rubbers (butyl, nitrile, etc), polyamides, polyacrylates, polyethers, polysulfones, polyethylenes, polypropylenes, polysiloxanes, polyvinyl acetates/polyvinyl esters, polyolefins, cyanoacrylates and polystyrenes. Typically, any thermosetting resin would function in this invention if the species can be modified to contain at least one of the following functional groups: anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, sulfonic esters/acids or other functional groups known to one skilled in the art to act as reactive sites for polymerization. For example, a polyolefin would not be suitable as a resin in this invention, as it has no reactive sites for binding and has poor material properties; however, an epoxy terminated polyolefin functions well when matched with the acidic groups of the flux-curing agents. An epoxy resin is presently preferred. The preferred level of incorporation of resin is 0.1-10% by weight of the die-attach material employed in the invention structures.

When a thermosetting resin is incorporated into the formulations of the invention, an optional catalyst or curing agent may also be added to ensure full cure of the resin during the die-attach process. The optional curing agent or catalyst is added to the varnish formulation to achieve superior adhesion or higher temperature performance of the cured polymer system. Curing agents or catalysts contemplated for use in the conductive film material include dicyandiamide, imidazoles, anhydrides, carboxylic acids, amides, imides, amines, alcohols/phenols, aldehydes/ketones, nitro compounds, nitriles, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, or other agents known to those skilled in the art. Any curing agent or catalyst capable of cross-linking the thermosetting resin would be suitable. Presently preferred is an imidazole. The optimum level of incorporation for the curing agent or catalyst is particular to the curing agent or catalyst selected. For the preferred imidazole catalyst, the optimum level of incorporation is in the range of 1-25 parts per hundred of the resin.

It will be appreciated by skilled artisans that the suitability of the sintering die-attach material for wafer-level application by a variety of methods; and the superior mechanical, electrical and thermal performance afforded by the sintering metallurgy provides a very advantageous technology platform. Although the film and paste forms of the die-attach material employed in the invention structures have some differences, the mechanical characteristics of the processed material are so dominated by the metal matrix formed that using both types in a single package is not likely to cause differential strain on the die. For instance, a film version of the sintering die-attach material could be applied to a side of a wafer with continuous metallization and then a paste version of sintering die-attach material could be applied via screen-printing to the opposite surface of the wafer in the pattern of metallization on that surface. In this example, the b-stageable paste die-attach material would be b-staged by irradiation of a catalyst in the formulation or by evolution of solvent at elevated temperature. Once diced, placed and bonded, the mechanical characteristics of the two materials, one applied as film and one as paste, would be so similar that negligible differential strain would be applied to the die in the semiconductor package.

Therefore, it will be appreciated by the skilled artisan that a wide variety of combinations of film, patterned film, continuous paste coating and patterned paste coating could be employed to achieve specific semiconductor package objectives and manufacturing flow requirements. It will also be appreciated by skilled artisans that patterning the sintering die-attach materials employed in the invention structures, whether film or paste, may be achieved by a variety of means either before or after application onto the wafer.

It should be noted that the foregoing discussion regarding the utility of the invention is not comprehensive and that methods and configurations not specifically recited, but which would be readily apparent to skilled artisans, are contemplated.

EXAMPLES

Example 1

Four sintering films were prepared for application to a wafer. The films contained 8 micron (average) spherical copper powder, $Sn_{80}:Bu_{20}$ alloy powder supplied in the configurations indicated below in Table 1, and a fluxing binder (16 weight % glutaric acid, 84 weight % N,N,N',N' tetrakis(2-hydroxyethyl) ethylenediamine). The films were cast from a solvent-based varnish (9 parts fluxing binder, 30 parts cyclopentantone, 41 parts copper, and 50 parts alloy), onto a polymer carrier (polyethyleneterephthalate), dried at 90 C.° to evaporate the solvent and applied to a wafer by lamination in a heated vacuum frame with 25° C. to 100° C. ramp in temperature at 5° C./min. The wafers were then singulated by dicing into individual die with a wafer saw equipped with a diamond blade. The die were placed onto silver-plated copper lead frames and sintered in a nitrogen environment in a box oven at 260° C. for 90 minutes. Upon cooling, the sintered die-lead frame assemblies were sheared at 260° C. and the force required to remove the die from the lead frame was measured.

The shear results are summarized below in Table 1 as die shear strength as a function of surface area of the alloy particles.

TABLE 1

| | Alloy powder surface area/weight (m²/g) | | | |
|---|---|---|---|---|
| | <0.10 | 0.15 | 0.22 | 0.29 |
| Film Sample Number | 1 | 2 | 3 | 4 |
| Die shear strength @ 260° C. (kg/mm2) | 0.20 | 0.30 | 0.70 | 0.75 |

As summarized in Table 1, higher shear strength was observed with increasing particle surface area. Thus, stronger, metallurgical-based mechanical connections were formed with increased contact between the alloy and copper particles in the film.

Example 2

Four sinterable films were prepared for application to wafers. The films contained 8 micron (average) spherical copper powder, $Sn_{80}:Bu_{20}$ alloy particles supplied in particle size ranges, shapes and average surface areas indicated below in Table 2, and the fluxing binder indicated in EXAMPLE 1. The films were cast from a solvent-based varnish onto a polymer carrier, dried to evaporate the solvent and strips of the film were applied to glass slides by lamination as described in EXAMPLE 1. The strips of film on glass slides were then sintered as described above in EXAMPLE 1 as described above, and the electrical resistance was measured using an ohmmeter in a four-point-probe configuration. The electrical resistivity was calculated based on the measured resistance and dimensions of the strips (resistance*width*thickness/length (all dimensions in cm).

The results, which are summarized in Table 2, indicate that both the alloy particle size distribution and average surface area were significant factors in determining the electrical properties of the sintered films. Smaller particles, with a higher proportion of oxide, tended to compromise the electrical properties even when the total average surface area of the alloy particles was approximately the same. Compare sample 1 versus 2; and sample 3 versus 4.

TABLE 2

| | Average Surface Area of Alloy Particles by Weight (m²/g) | | | |
|---|---|---|---|---|
| | <0.15 | 0.15 | 0.24 | 0.29 |
| Film Sample Number | 1 | 2 | 3 | 4 |
| Alloy Particle Shape | Spherical | Flake | Flake | |
| Alloy Particle Size | 8 micron (average) | 100% Large Flake* | 50% Large/ 50% Small Flake** | 25% Large/ 75% Small Flake |
| Electrical resistivity (μΩ * cm) | 180 | 63 | 86 | 85 |

*milled from Type 7 alloy powder (1-10 μm)
**milled from Type 6 alloy (5-20 μm)

Overall, the results indicate that a larger flake alloy provides higher electrical conductivity over the range of sinterable film materials tested.

Example 3

A sinterable die-attach paste was prepared containing 91 weight percent metal particles and the Organics Mixture detailed below in Table 3. Briefly, the metals were weighed into Hobart bowl and blended. The organic components were weighed into separate bowl, the metals were then added to the organic components and hand mixed to wet the metals. The combination containing the components listed in Table 4 was mixed in Hobart mixer for 5 min, and then transferred to 1.5 L D.P. mixing pot, and mix with degassing for 20 min. at 30 rpm, in a 25° C. waterbath. The final mixture was filtered through a 100-150-100 disc filter prior to use.

TABLE 3

| Organic Mixture | |
|---|---|
| Ingredient | Weight % |
| R1001 - Ester oligomer | 25.00 |
| Hypox RF 1341 | 12.50 |
| DABA/TEOA | 33.33 |
| A3008 - Antifoam 1400 | 4.17 |
| S4001 - Butyl Carbitol | 25.00 |
| | 100.00 |

TABLE 4

| Final Mix | |
|---|---|
| Ingredient | Weight % |
| Organics Mix w/BC pre-added | 11.65 |
| F2024 - 2 um Mitsui Copper | 14.56 |
| F2014 - 8 um Cu Powder, HK-500 | 38.84 |
| F2022 - 80Sn/20Bi, type 6, HK-500 | 34.95 |
|  | 100.00 |

The paste mixture was applied to a silver-backed semiconductor wafer by screen printing through a stainless steel mesh screen (230 mesh screen) to form a 40 micron thick layer of paste on the wafer. The entire silver-metallized surface of the wafer was coated. The paste-coated wafer was b-staged by baking at 90° C. for 30 minutes to render the paste non-tacky. A dicing tape was applied over the b-staged sinterable die-attach paste. The wafer bearing the sinterable die-attach paste was then singulated into individual die. Identical, singulated die were tack-bonded onto copper and silver-plated-copper lead frames using a Hybond die bonder with 1 second of 250 g applied force at 110° C., and then sinter-bonded to the metallized lead frames in an oven with nitrogen atmosphere at 260° C. for 90 minutes.

Upon cooling, the sintered parts were sheared at 260° C. using a programmable DAGE 4000 Bondtester die shear tool (Nordson DAGE, Aylesbury, Buckinghamshire, UK). The die shear strengths observed were 0.7 and 1.0 kg/mm$^2$ on the copper and silver-plated-copper surfaces, respectively. At the shearing temperature of 260° C., solder alloys typically used for die-attach would be molten, and therefore provide no bonding whatsoever, while die shear strengths for typical non-sinterable die-attach adhesives are be <0.5 kg/mm$^2$. Thus, the sinterable die-attach pastes described in this EXAMPLE provide superior bonding at the tested temperature when compared to both standard solder and traditional die-attach adhesives.

Example 4

The b-stageable sinterable die-attach paste of EXAMPLE 3 was coated onto copper lead frames and b-staged as described in EXAMPLE 3. Singulated die with gold back metallization were sintered to copper lead frames in two batches. The first batch was assembled and sintered immediately after b-staging. The second batch was assembled and sintered one week later, following storage at room temperature. The DAGE die shear tool (see EXAMPLE 3) was used to shear the parts at 260° C. Both the freshly prepared and week-old sintered die-attach pastes had die shear strengths well in excess of the 0.5 kg/mm2 target of traditional die-attach adhesives (1.1 and 0.8 kg/mm2, respectively).

Example 5

To determine whether b-staged sinterable die-attach paste would remain well attached when the wafer was diced, a silver-metallized semiconductor wafer bearing b-staged sinterable die-attach paste was prepared as in EXAMPLE 3. The paste-coated wafer was then singulated using two different types of dicing tape: UV releasable tape and pressure sensitive adhesive tape. In both cases, the b-staged paste layer remained intact on the wafer during the singulation (dicing) process.

Example 6

To determine the effect of tack-bonding conditions on the strength of sintered joints, a gold-backed wafer coated with sinterable die-attach paste was prepared as described above in EXAMPLE 3. The wafer was singulated and individual die were tack-bonded as described above onto copper lead frames under the conditions listed below in Table 5.

TABLE 5

| | Tack-Bonding Conditions | | | |
|---|---|---|---|---|
| Die Sample # | Time (msec) | Temp (° C.) | Force (grams) | Shear Strength 260° C. (kg/mm$^2$) |
| 1 | 100 | 110 | 50 | 0.2 |
| 2 | 100 | 110 | 250 | 0.3 |
| 3 | 100 | 130 | 50 | 0.3 |
| 4 | 100 | 130 | 250 | 0.5 |
| 5 | 300 | 110 | 50 | 0.3 |
| 6 | 300 | 110 | 250 | 0.6 |
| 7 | 300 | 130 | 50 | 0.3 |
| 8 | 300 | 130 | 250 | 0.5 |

The parts were sintered as described in EXAMPLE 3. The resulting high temperature die shear strength is indicated in the column on the right side of Table 5. Generally, shear strength was increased when the temperature, pressure and duration of tack-bonding was increased.

What is claimed is:
1. An assembly comprising:
   a) a semiconductor wafer having a top surface and an opposing bottom surface, wherein at least a portion of the top surface, the bottom surface or both top and bottom surfaces is metallized with a solderable metal;
   b) at least one b-staged, sinterable die-attach material disposed on at least a portion of the metallized portion of the wafer surface, wherein the die attach material comprises:
      i) an organic binder comprising:
         (1) a flux, and
         (2) a means to render the flux inert as a consequence of a die-attach process; and
      ii) a filler comprising a mixture of metallic particles, wherein the mixture of particles comprises at least one reactive metallic element R1 and at least one reactive metallic element R2, wherein R1 and R2 are capable of undergoing transient liquid phase sintering at temperature T1.
2. A die singulated from the assembly of claim 1.
3. An assembly comprising the die of claim 2 and at least one metallized adherend, wherein the b-staged sinterable die-attach material is tack-bonded or is sintered to the at least one metallized adherend or is sintered, thereby bonding the die to the at least one metallized adherend.
4. The assembly of claim 1, wherein the solderable metal covers substantially all of the top surface, the bottom surface or both top and bottom surfaces of the wafer.
5. The assembly of claim 1, wherein at least a portion of each of the top and bottom surfaces is metallized, and optionally, wherein the solderable metal on the top surface is different than the solderable metal on the bottom surface.
6. The assembly of claim 3, wherein said adherend is selected from the group consisting of a lead-frame, a laminate-based package, a ceramic-based package, a metal clip, a heat sink, and a second semiconductor die.
7. The assembly of claim 1, wherein the b-staged, sinterable die-attach material is a film, and optionally, a) wherein the film is patterned to cover the metallized portion of the semiconductor wafer, and optionally, wherein the film is patterned after it is disposed on the metallized portion of the semiconductor wafer; or b) wherein the die-attach material comprises a polymer selected from the group consisting of: phenoxies, acrylics, rubbers, polyamides, polyacrylates, polyethers, polysulfones, polyethylenes, polypropylenes, polysiloxanes, polyvinyl acetates/polyvinyl esters, polyolefins, cyanoacrylates, and polystyrenes, and optionally, wherein the polymer has a molecular weight between about 10,000 Da and 200,000 Da.

8. The assembly of claim 1, wherein the sinterable die-attach material is a paste optionally disposed on the metallized portion of the wafer surface by a method selected from the group consisting of: doctor blade; screen or stencil printing; and pad transfer.

9. The assembly of claim 8, wherein the paste is a continuous coating covering substantially all of the top and bottom surfaces of the wafer or the paste selectively covers only the solderable metal on the wafer surface.

10. The assembly of claim 8, wherein said paste is b-staged using by a process selected from the group consisting of: exposure to irradiation, evolution of solvent, or a combination thereof.

11. The assembly of claim 1, wherein the b-staged, sinterable die-attach material is either:

a) a film or a paste disposed on both the top and bottom surfaces of the wafer; or b) a film disposed on one of the top or bottom surfaces and a paste disposed on the opposite surface.

12. A die singulated from the assembly of claim 11.

13. A package assembly comprising at least one die of claim 12 and a quad-flat no-leads (QFN) semiconductor package having a clip and a lead frame, wherein the at least one die is positioned in the package assembly such that at least a portion of the b-staged, sinterable die-attach material of the at least one die contacts the clip and the lead frame, thereby forming a mechanical, thermal and electrical connection between the clip and the lead frame when the die-attach material is sintered.

14. The assembly of claim 1, wherein T1 has a value between about 100° C. and about 300° C. or between about 120° C. and about 260° C.

15. The assembly of claim 1, wherein R1 is selected from the group consisting of: copper, silver, gold, platinum, indium, gallium, aluminum, palladium, beryllium, rhodium, nickel, cobalt, iron, molybdenum, tin and bismuth.

16. The assembly of claim 1, wherein R2 is selected from the group consisting of Sn, Bi, Pb, Cd, Zn, Ga, In, Te, Hg, Tl, Sb, Se, and Po.

17. The assembly of claim 1, wherein the means to render the flux inert as a consequence of a die-attach process is a chemical reaction with a thermosetting resin selected from the group consisting of epoxies, novalac phenolics, cresolic phenolic, polyurethanes, polyimides, bismaleimides, maleimides, cyanate esters, polyvinyl alcohols, polyesters, polyureas and combinations thereof.

18. The assembly of claim 1, wherein the flux comprises an organic acid.

19. The assembly of claim 1, wherein the metallic particles have a size between a nanoparticle and about 100 micron in diameter.

20. The assembly of claim 1, wherein the metallic particles consist of single metallic elements or alloys of two or more metallic elements; or wherein all or a portion of the metallic particles comprise an organic coating or a first metallic element covering a second metallic element or a non-metallic particle core.

21. The assembly of claim 1, wherein the metallic particles have a shape selected from the group consisting of spherical, substantially spherical, non-spherical, or near-the metallic particles, dendritic, flake, platelet, spongiform, and combinations thereof.

22. The assembly of claim 21, wherein at least a portion of the metallic particles are flake or platelet shaped and optionally the portion of flake or platelet shaped metallic particles comprises R2.

23. The assembly of claim 22, wherein the portion of flake or platelet shaped metallic particles comprising R2 have a surface area greater than 0.15 $m^2$/gram.

24. The assembly of claim 1, wherein the b-staged, die-attach material has a thickness between about 1 micron and about 100 microns.

25. The assembly of claim 18, wherein the organic acid is selected from the group consisting of phenols, carboxylic acids, acid anhydrides, and combinations thereof, and optionally comprises a tertiary amine, wherein the tertiary amine is optionally an alkanolamine.

* * * * *